(12) United States Patent
Taniguchi (10) Patent No.: US 6,661,700 B2
(45) Date of Patent: Dec. 9, 2003

(54) SEMICONDUCTOR MEMORY DEVICE

(75) Inventor: Koji Taniguchi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/118,125

(22) Filed: Apr. 9, 2002

(65) Prior Publication Data

US 2003/0016554 A1 Jan. 23, 2003

(30) Foreign Application Priority Data

Jul. 18, 2001 (JP) ........................................ 2001-217851

(51) Int. Cl.[7] .............................................. G11C 11/24
(52) U.S. Cl. .......................................... 365/149; 365/63
(58) Field of Search ................................ 365/149, 131, 365/230.06, 63

(56) References Cited

U.S. PATENT DOCUMENTS 5,699,293 A * 12/1997 Tehrani et al. ............... 365/131

6,449,182 B1 * 9/2002 Ooishi ........................ 365/149

FOREIGN PATENT DOCUMENTS

JP           5-266670           10/1993

* cited by examiner

*Primary Examiner*—Huan Hoang
(74) *Attorney, Agent, or Firm*—McDermott, Will & Emery (57) ABSTRACT

A semiconductor memory device of the present invention has a memory array structure wherein a plurality of word lines and a plurality of bit lines for selecting a predetermined memory cell are arranged to intersect with one another, and includes two memory cells (e.g., MC1 and MC2) constituting one bit and a sense amplifier electrically connected to the both memory cells through the bit lines. The word line (e.g., WL3A) electrically connected to one (e.g., MC1) of the two memory cells constituting one bit and the word line (e.g., WL3B) electrically connected to the other memory cell (e.g., MC2) are arranged opposite each other across the sense amplifier. Thus, a twin-cell type semiconductor memory device capable of reducing a plane area occupied by a memory cell part while maintaining good retention characteristics.

3 Claims, 7 Drawing Sheets

SEMICONDUCTOR MEMORY DEVICE

BACKGROUND OF THE INVENTION

1. Field of the Invention

The present invention relates to a semiconductor memory device and particularly relates to a semiconductor memory device including a twin-cell type DRAM (Dynamic Random Access Memory) characterized by low consumption power suited for portable equipment.

2. Description of the Background Art

In recent years, as the performance of portable terminals including cellular phones have enhanced, demand for mass storage RAM's rises. A portable equipment, which is driven by batteries, has employed, as an RAM, an SRAM (Static RAM) capable of realizing low consumption power. However, the SRAM cannot satisfy and follow up mass storage demand accompanying enhanced system function and it has become, therefore, necessary to mount a DRAM, which can easily realize mass storage, on a portable equipment.

Nevertheless, because of the structural characteristics of the DRAM, the state of the DRAM in which memory cells hold data is off balance and the data stored in the memory cells disappear when a certain period of time passes. Due to this, the DRAM is required to rewrite the stored data (or refresh the data) before the data disappears. This refresh operation consumes current for changing and discharging bit lines. That is why a DRAM has a higher consumption current than an SRAM which can dispense with a data refresh operation.

To mount a DRAM on a portable equipment in place of an SRAM, it is necessary to reduce current consumed by this refresh operation. To this end, it is the most effective to lengthen data retention time and to decrease the number of times (frequency) of the refresh operation.

Figure 5:
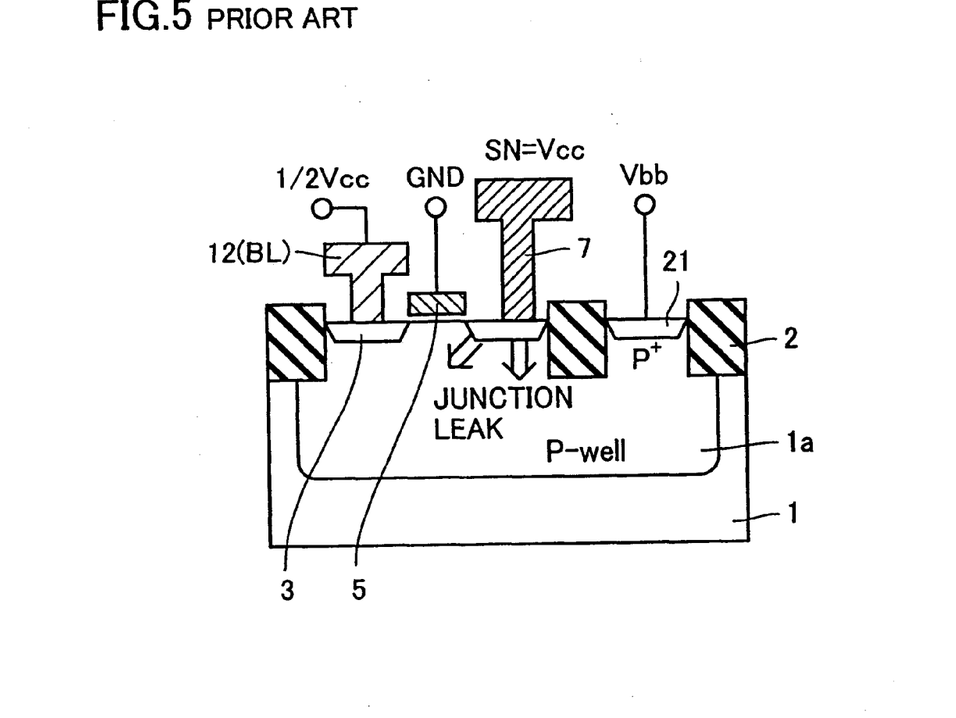
FIG. 5 is a schematic cross-sectional view showing the state of a DRAM memory cell right after "H" data has been written to the cell.
Figure 6:
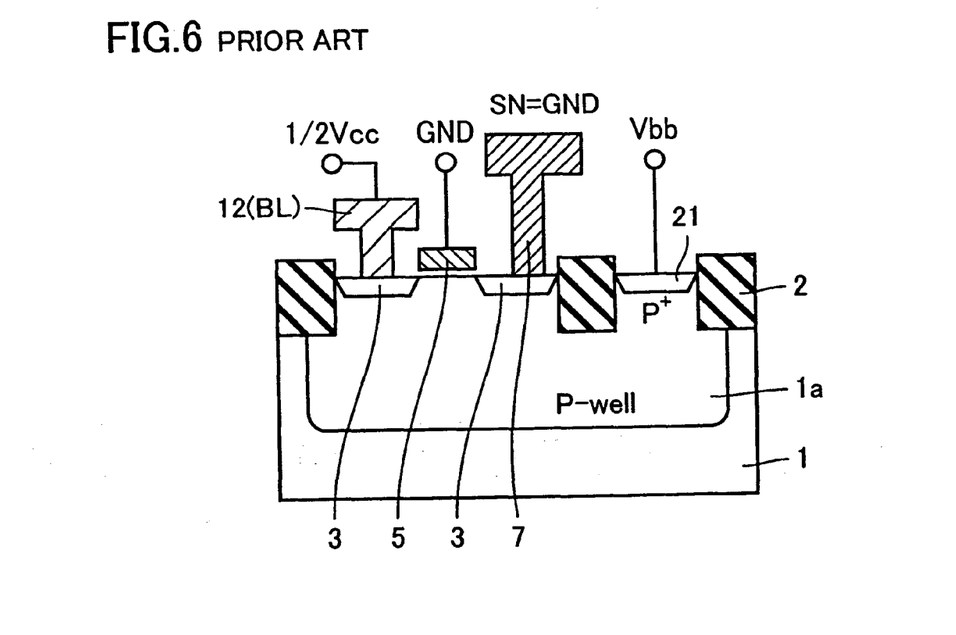
FIG. 6 is a schematic cross-sectional view showing the state of a DRAM memory cell right after "L" data has been written to the cell.

FIG. 5 shows a state of a DRAM memory cell right after "H" data has been written to the cell. FIG. 6 shows a state of the DRAM memory cell right after "L" data has been written to the cell.

Referring to FIGS. 5 and 6, the DRAM memory cell has a 1-transistor, 1-capacitor structure consisting of a memory transistor and a capacitor. The memory transistor is formed in a p type well region 1a electrically isolated by isolation regions 2 of a semiconductor substrate 1. This memory transistor includes a pair of source drain regions 3 formed on the surface of p type well region 1a and a gate electrode (word line) 5 formed in a region put between paired source and drain regions 3 through a gate insulating film. The storage node (lower electrode) 7 of the capacitor is electrically connected to one of paired source and drain regions 3 and a bit line 12 is electrically connected to the other of paired source and drain regions 3. Also, a p+ region 21 is formed on the surface of p type well region 1a.

To simplify the drawings, the cell plate (upper electrode) of the capacitor and the like are not shown in FIGS. 5 and 6.

In FIG. 5, the potential of storage node 7 right after data has been written is Vcc (which is normally about 2V), the potential of bit line 12 is ½ Vcc, the potential of the substrate (p type well region 1a) is Vbb (which is normally about −1V) and the potential of word line 5 is GND (=0V). In this state, the memory transistor is turned off.

An inverse bias of |Vcc|+|Vbb| (3V in this case) is applied to the pn junction between storage node 7 and the substrate (p type well region 1a). Due to this, a junction leak current flows from storage node 7 to substrate 1a and the potential of storage node 7, therefore, gradually decreases. If the potential of storage node 7 decreases from Vcc to be lower than the potential of bit line 12, i.e., ½ Vcc, the stored data is erroneously recognized as not "H" but "L" data, meaning that the stored data is destroyed.

Meanwhile, in FIG. 6, the potential of storage node 7 is GND (=0V). In this case, too, an inverse bias of |GND|+|Vbb| (1V in this case) is applied to the pn junction between storage node 7 and substrate 1a and a junction leak current flowing from storage node 7 to substrate 1a exists. However, since the potential of storage node 7 is originally lower than the potential of bit line 12, i.e., ½ Vcc, the potential of storage node 7 does not exceed ½ Vcc. Due to this, "L" data is not destroyed.

Figure 7:
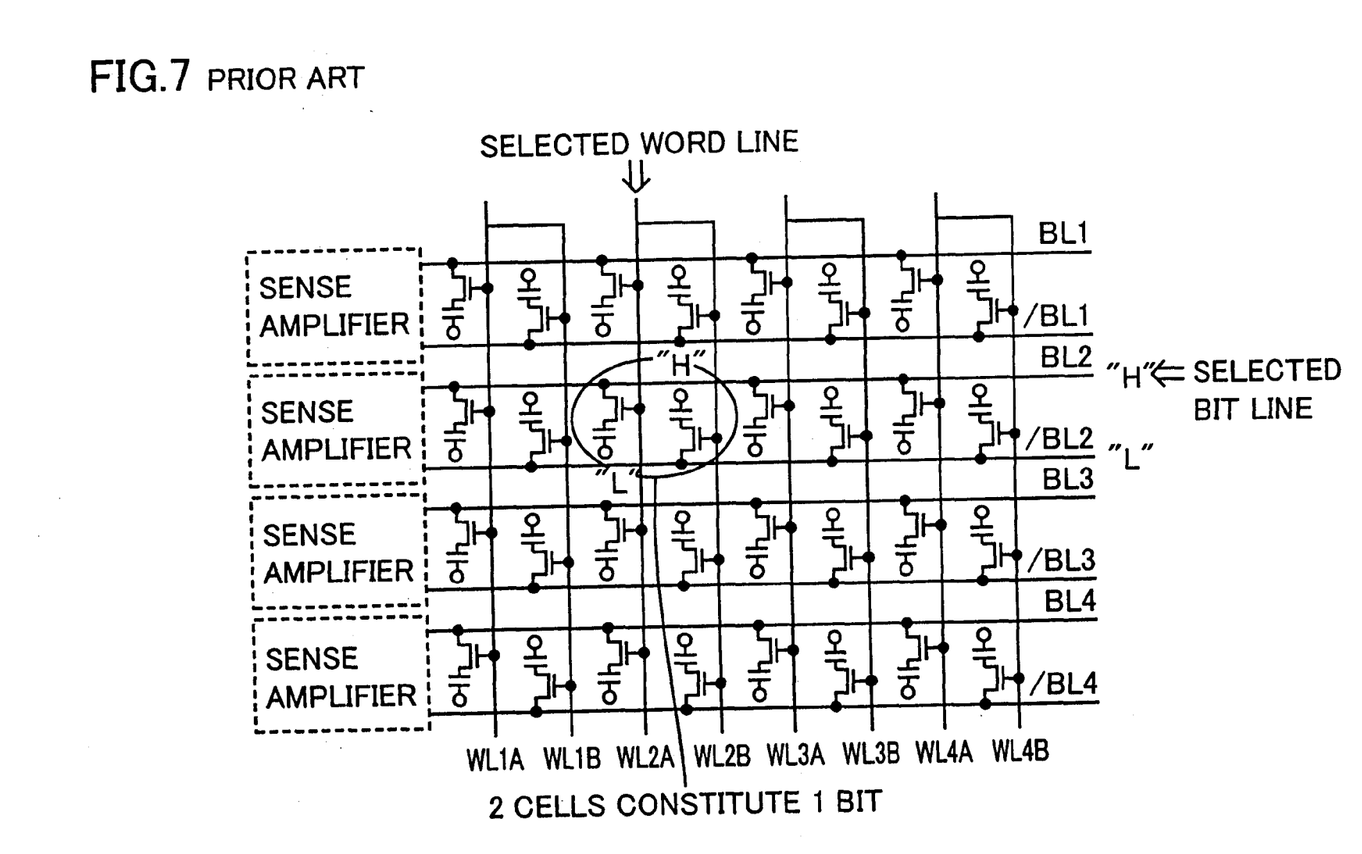
FIG. 7 is a schematic circuit diagram showing the constitution of a conventional semiconductor memory device.

It is a twin-cell system that is intended to considerably enhance data retention characteristics using the characteristics that "L" data is not destroyed. FIG. 7 is a typical view of DRAM cells according to the twin-cell system.

Referring to FIG. 7, the twin-cell system is such that two memory cells (a pair of memory cells) constitute one bit. If "H" data is stored in a certain memory cell, "L" data is stored in a memory cell which forms, together with the certain memory cell, a memory cell pair. If "L" data is stored in a certain memory cell, "H" data is stored in a memory cell which forms, together with the certain memory cell, a memory cell pair.

Each of the paired memory cells is electrically connected to each of a pair of bit lines and also electrically connected to each of two word lines selected simultaneously. It is noted that the paired bit lines are electrically connected to a sense amplifier amplifying a small potential difference generated between the paired bit lines to a power supply voltage.

Figure 8:
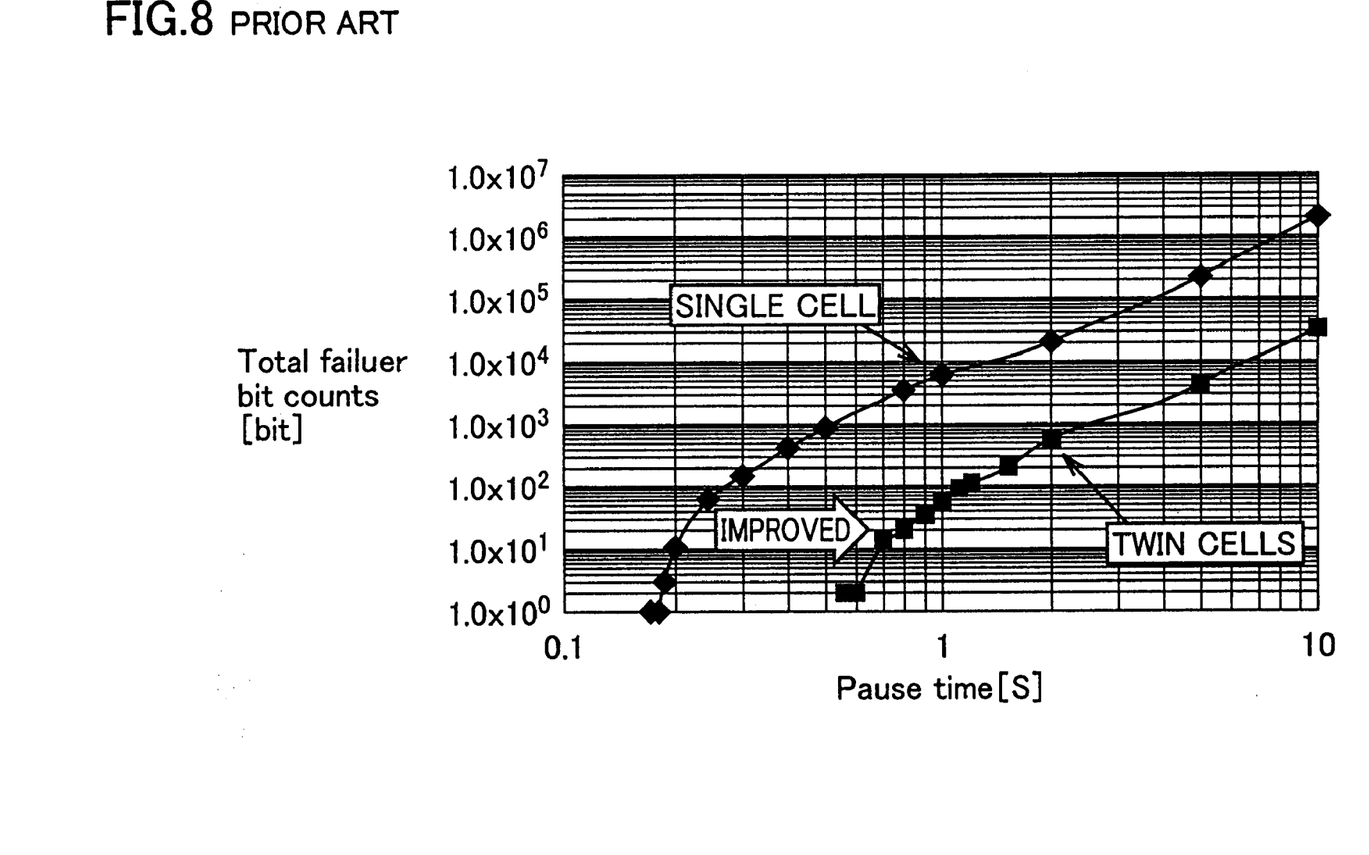
FIG. 8 is a graph showing the comparison between an ordinary single-cell type memory and a twin-cell type memory with respect to data retention characteristics.

FIG. 8 is a graph showing the comparison between an ordinary single-cell type memory and a twin-cell type memory with respect to retention characteristics. Referring to FIG. 8, the horizontal axis is pause time since data is written until the data is read and the vertical axis is total failure bit counts per chip. As a result of the comparison, it is seen that if the single-cell type memory is formed into the twin-cell type memory, retention characteristics is improved about fourfold.

However, the twin-cell type memory constitutes one bit out of two cells and has a larger chip size than that of the single-cell type memory, thereby disadvantageously pushing up cost. In case of the twin-cell type memory, the area of a memory cell part occupies about 50% of a chip area. Due to this, if the area of the memory cell part doubles, the chip area of the twin-cell type memory becomes 1.5 times as large as that of the single-cell type memory.

SUMMARY OF THE INVENTION

It is an object of the present invention to provide a twin-cell type semiconductor memory device capable of reducing the area of a memory cell part while maintaining data retention characteristics.

A semiconductor memory device according to the present invention is a semiconductor memory device having a memory array structure in which a plurality of word lines and a plurality of bit lines for selecting a predetermined memory cell are arranged to intersect with one another, characterized by including: two memory cells constituting one bit; and a sense amplifier electrically connected to both of the two memory cells constituting the one bit, through the bit lines. A first word line electrically connected to one of the two memory cells constituting the one bit and a second word line electrically connected to the other one of the two memory cells are arranged opposite each other across the sense amplifier.

According to the semiconductor memory device of the present invention, the twin-cell system wherein two memory cells constitute one bit is adopted and data retention time can be, therefore, lengthened. This can decrease the number of times (frequency) of data refresh operation and reduce current consumed by the refresh operation. It is, therefore, possible to reduce the consumption current of DRAM.

Further, since the first and second word lines are arranged opposite each other across the sense amplifier, the two memory cells constituting one bit are naturally arranged opposite each other across the sense amplifier. As a result, there is no need to provide two bit lines, forming a bit line pair having a small potential difference at the time of reading data, on one side of the sense amplifier. This enables restrictions to pattern arrangement to be relaxed, the memory cells to be arranged more compactly than the conventional memory and an area occupied by the memory cells in a chip to be smaller than that in the conventional case.

Preferably, in the semiconductor memory device stated above, the first and second word lines are electrically connected to each other and electrically connected to a common word line driver.

By doing so, it is possible to simultaneously select and drive the two memory cells constituting one bit.

Preferably, in the semiconductor memory device stated above, a pitch size of the word lines and a pitch size of the bit lines are 2×F, respectively, a plane area occupied by one memory cell is 6×F$^2$.

By doing so, it is possible to reduce the area occupied by the memory cells in a chip compared with that in the conventional case.

Preferably, in the semiconductor memory device stated above, each memory cell is a DRAM memory cell.

By doing so, it is possible to obtain a DRAM capable of considerably improving retention characteristics and reducing the rate of the area of a memory cell part which occupies a chip area compared with that in the conventional case.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter with reference to the drawings.

Figure 1:
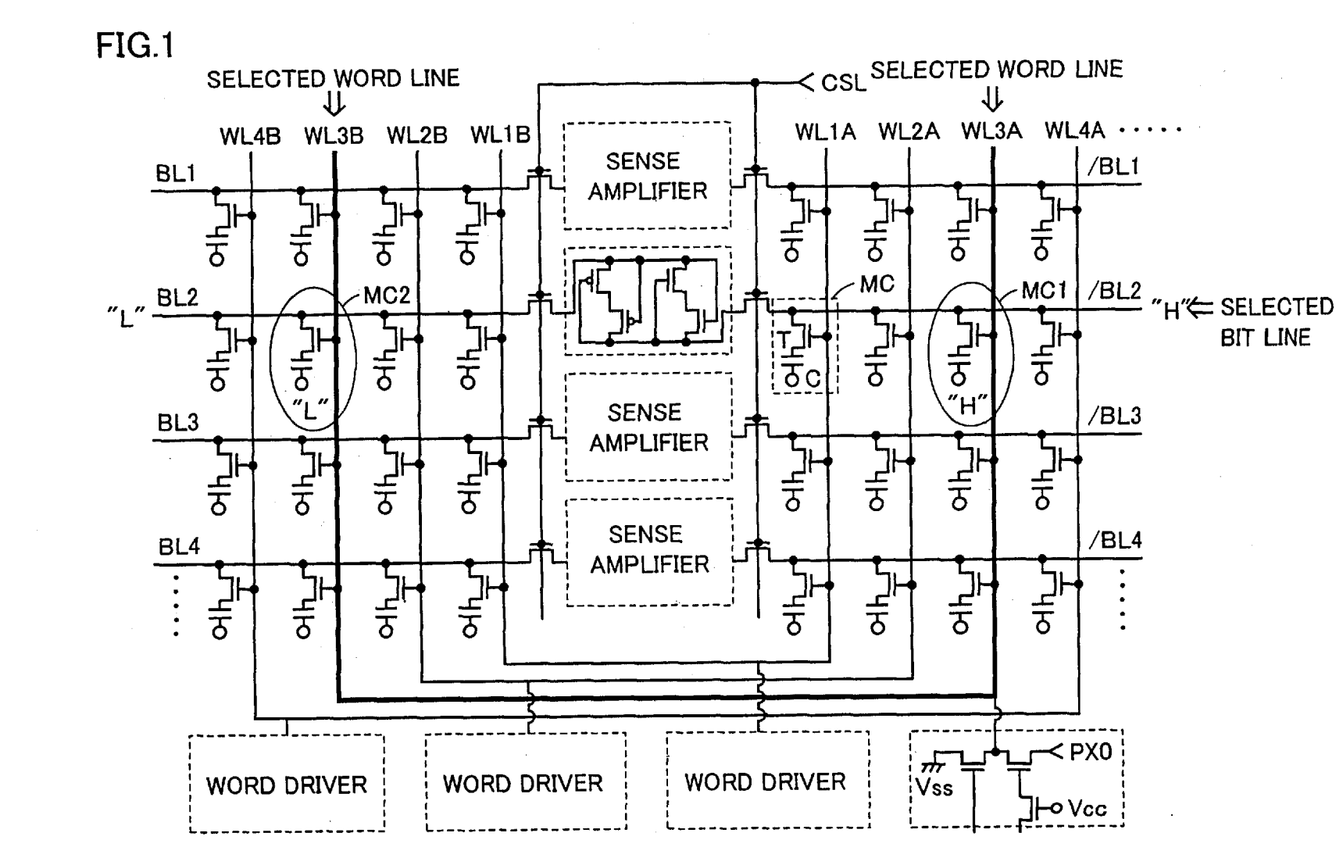
FIG. 1 is a schematic circuit diagram showing the constitution of a semiconductor memory device in one embodiment according to the present invention.

Referring to FIG. 1, a plurality of word lines WL1A, WL1B, WL2A, WL2B, . . . and a plurality of bit lines BL1, /BL1, BL2, /BL2, . . . are arranged to intersect one another and memory cells MC's are arranged in the vicinity of the respective intersection parts in a DRAM memory array.

Each memory cell MC has a 1-transistor, 1-capacitor structure consisting of a memory transistor T and a capacitor C. The gate electrode of memory transistor T is electrically connected to a word line. One of a pair of a source and a drain is electrically connected to a bit line and the other thereof is electrically connected to capacitor C.

A word driver is electrically connected to each of the word lines to make the word line at a selected level. Also, a sense amplifier is electrically connected to a pair of bit lines to amplify a small potential difference between the paired bit lines to a power supply voltage. Each word driver includes, for example, three nMOS (Metal Oxide Semiconductors) transistors and each sense amplifier includes, for example, two pMOS transistors and two nMOS transistors.

According to the present invention, a twin-cell system wherein two memory cells (e.g., MC1 and MC2) constitute one bit is adopted. Each of the memory cells (e.g., MC1 and MC2) constituting one bit is electrically connected to each of the paired bit lines (e.g., BL2 and /BL2). In this embodiment, the paired bit lines (e.g., BL2 and /BL2) are arranged opposite each other across the sense amplifier (arranged on the right and left sides of the sense amplifier, respectively), thus forming an open bit line structure. Due to this, the two memory cells (e.g., MC1 and MC2) constituting one bit are arranged opposite each other across the sense amplifier (arranged on the right and left sides of the sense amplifier, respectively). Further, the word lines (e.g., WL3A and WL3B) electrically connected to the respective two memory cells (e.g., MC1 and MC2) constituting one bit and selected simultaneously are arranged opposite each other across the sense amplifier (arranged on the right and left sides of the sense amplifier, respectively.

The two word lines (e.g., WL3A and WL3B) selected simultaneously are electrically connected to each other and also electrically connected to a common word driver. Further, the two bit lines (e.g., BL2 and /BL2) forming a bit line pair, are electrically connected to a common sense amplifier.

Normally, in single-cell type DRAM of the open bit line structure, only one of the bit lines forming a bit line pair intersects a word line, with the result that noise influence caused by the word lines is asymmetrically given to the bit lines and DRAM thereby malfunctions. In twin-cell type DRAM, by contrast, two word lines are selected simultaneously and the two word lines intersects with right and left bits lines, respectively. For that reason, noise influence caused by the word lines is uniformly given to the two bit lines forming a bit line pair and DRAM does not malfunction.

Further, in this embodiment, the open bit line structure is adopted for twin-cell type DRAM and a memory cell layout which cannot be realized by the conventional folded bit line structure can be realized, which will be described hereinafter.

Figure 2:
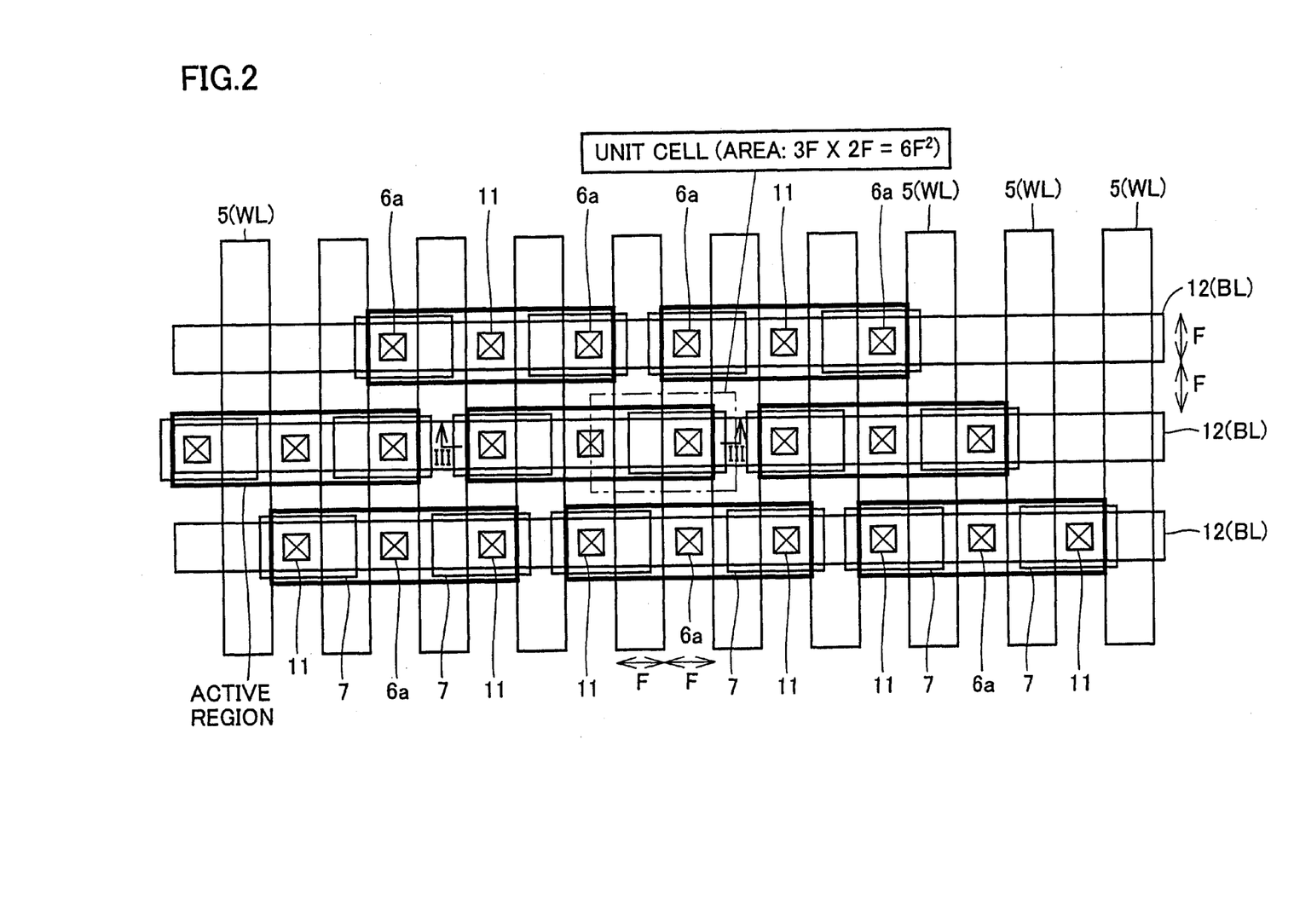
FIG. 2 is a plan view showing the memory cell layout of a semiconductor memory device in one embodiment according to the present invention.

Referring mainly to FIG. 2, a plurality of word lines 5 and a plurality of bit lines 12 are arranged to be orthogonal to one another and DRAM memory cells are arranged in the vicinity of regions in which word lines 5 intersect with bit lines 12, respectively.

Figure 3:
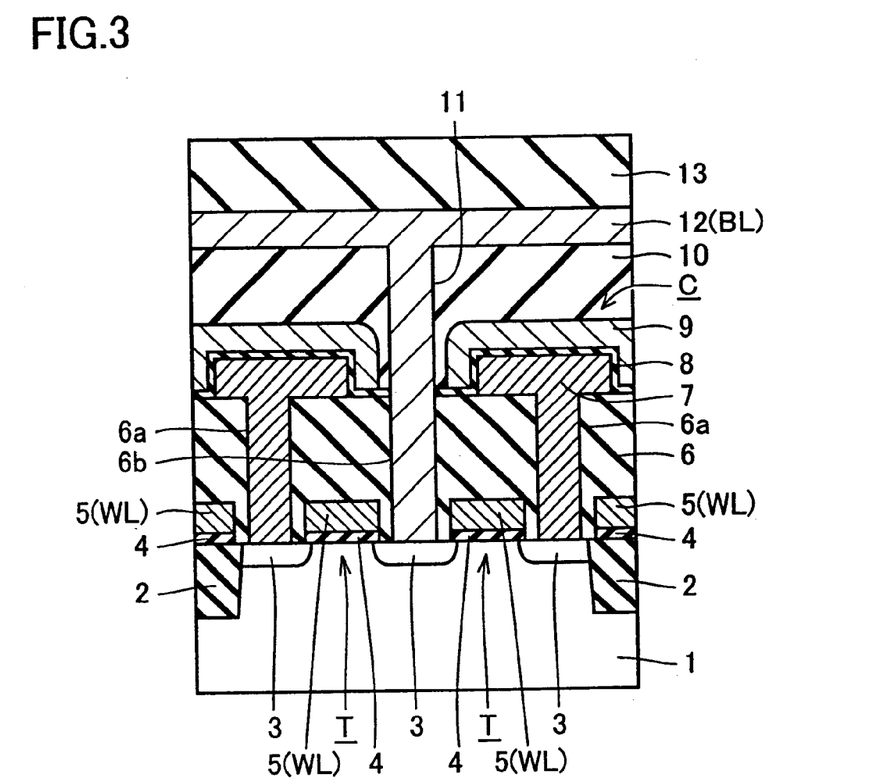
FIG. 3 is a schematic cross-sectional view taken along line III—III of FIG. 2.

Referring mainly to FIG. 3, a DRAM memory cell has the 1-transistor, 1-capacitor structure as stated above. Memory transistor T constituting the memory cell is formed in an active region electrically isolated by isolation regions 2 of semiconductor substrate 1. Memory transistor T includes a pair of source and drain regions 3 formed at the surface of the active region and a gate electrode (word line) 5 formed on a region put between the paired source and drain regions 3 through a gate insulating film 4.

An interlayer insulating film 6 is formed to cover memory transistor T. A contact hole 6a reaching one of paired source and drain regions 3 is formed in interlayer insulating film 6. Capacitor C is formed so as to be electrically connected to one of paired source and drain regions 3 through contact hole 6a.

Capacitor C includes a storage node 7 electrically connected to one of paired source and drain regions 3 and a cell plate 9 facing storage node 7 through a capacitor dielectric layer 8.

An interlayer insulating film 10 is formed to cover capacitor C. A contact hole 11 reaching the other of paired source and drain regions 3 is formed in interlayer insulating films 10 and 6. Bit line 12 is formed on interlayer insulating film 10 so as to be electrically connected to the other of paired source and drain regions 3 through the contact hole II. An insulating film 13 is formed on bit line 12.

Referring to FIG. 1, the two word lines which are selected simultaneously are arranged opposite each other across the sense amplifier and the two word lines which are selected simultaneously are not, therefore, arranged on only one side of the sense amplifier in this embodiment. Further, since DRAM has the open bit line structure, it does not happen that both of the two bit lines forming a bit line pair are arranged on only one side of the sense amplifier. Due to this, there are fewer restrictions to the arrangement of memory cells with respect to the word lines and the bit lines and the memory cells can be arranged compactly as shown in FIG. 2. As a result, if the pitch of bit lines 12 and the pitch of word lines 5 are 2×F, respectively, a plane area occupied by a unit cell (one memory cell) can be made as small as $3F \times 2F = 6F^2$.

Figure 4:
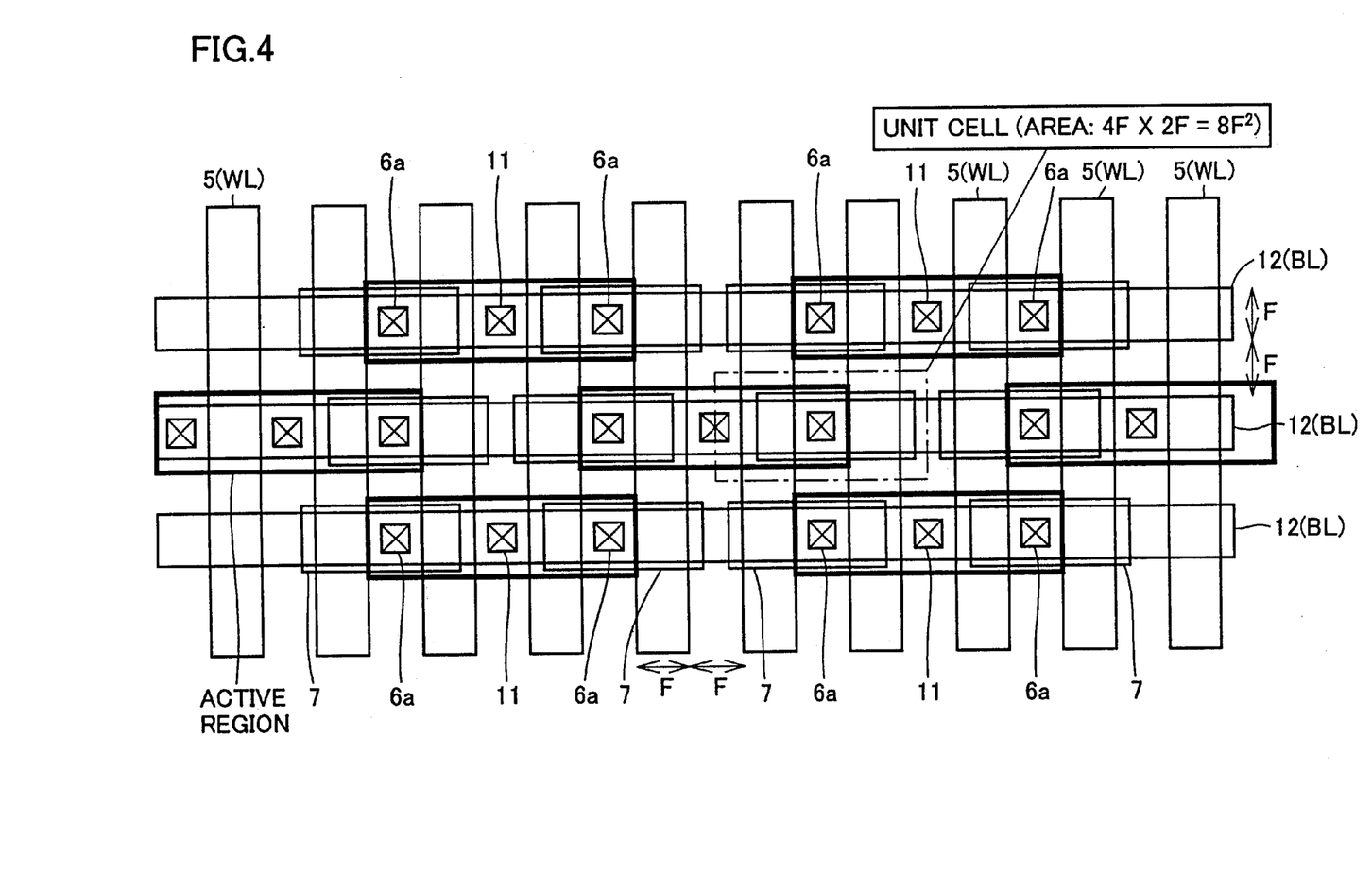
FIG. 4 is a plan view showing the memory cell array layout of a semiconductor memory device having a folded bit line structure.

On the other hand, with the folded bit line structure shown in FIG. 7, a memory cell layout is that shown in FIG. 4. On this memory cell layout, both of two bit lines 12 forming a bit line pair must be arranged on only one side of the sense amplifier. Likewise, two word lines 5 selected simultaneously must be arranged on only one side of the sense amplifier. Due to this, restrictions are given to the memory cell layout and memory cells cannot be arranged compactly. As a result, the plane area occupied by a unit cell is as large as $4F \times 2F = 8F^2$.

As stated so far, according to the embodiments of the present invention, the twin-cell system wherein two memory cells constitute one bit is adopted and data retention time can be, therefore, lengthened. This can decrease the number of times (frequency) of data refresh operation and reduce current consumed by the refresh operation. It is, therefore, possible to reduce the consumption current of DRAM.

Furthermore, according to the embodiments of the present invention, the twin-cell type, open bit line structure is adopted. Due to this, there are fewer restrictions to the arrangement of memory cells in a memory array and the memory cells can be arranged compactly. As a result, compared with the conventional folded bit line structure, it is possible to reduce the plane area occupied by the memory cells to 6/8.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a memory array structure having a plurality of word lines and a plurality of bit lines for selecting a predetermined memory cell arranged to intersect with one another, comprising:

two memory cells constituting one bit, each of said memory cells being a DRAM memory cell; and a sense amplifier electrically connected to both of said two memory cells constituting the one bit, through said bit lines, and wherein a first word line electrically connected to one of said two memory cells constituting the one bit and a second word line electrically connected to the other one of said two memory cells are arranged opposite each other across said sense amplifier.

2. The semiconductor memory device according to claim 1, wherein said first and second word lines are electrically connected to each other and electrically connected to a common word line driver.

3. The semiconductor memory device according to claim 1, wherein if a pitch size of said word lines and a pitch size of said bit lines are 2×F, respectively, a plane area occupied by one memory cell is $6 \times F^2$.

* * * * *

UNITED STATES PATENT AND TRADEMARK OFFICE
CERTIFICATE OF CORRECTION

PATENT NO. : 6,661,700 B2
DATED : December 9, 2003
INVENTOR(S) : Koji Taniguchi It is certified that error appears in the above-identified patent and that said Letters Patent is hereby corrected as shown below:

Title page,
Item [73], Assignee, change "Mitsubishi Denki Kabushiki Kaisha, Tokyo (JP)" to
-- Renesas Technology Corp., Tokyo (JP) --

Signed and Sealed this

Third Day of May, 2005

JON W. DUDAS
*Director of the United States Patent and Trademark Office*